US 9,543,114 B2

(12) United States Patent
Adibi et al.

(10) Patent No.: US 9,543,114 B2
(45) Date of Patent: Jan. 10, 2017

(54) IMPLANT MASKING AND ALIGNMENT SYSTEM WITH ROLLERS

(71) Applicant: Intevac, Inc., Santa Clara, CA (US)

(72) Inventors: Babak Adibi, Los Altos, CA (US); Vinay Prabhakar, Cupertino, CA (US); Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 0 days.

(21) Appl. No.: 14/819,402

(22) Filed: Aug. 5, 2015

(65) Prior Publication Data

US 2016/0042913 A1 Feb. 11, 2016

Related U.S. Application Data

(60) Provisional application No. 62/033,104, filed on Aug. 5, 2014.

(51) Int. Cl.
G01N 23/00 (2006.01)
H01J 37/20 (2006.01)
H01J 37/18 (2006.01)
H01J 37/317 (2006.01)

(52) U.S. Cl.
CPC .......... *H01J 37/20* (2013.01); *H01J 37/185* (2013.01); *H01J 37/3171* (2013.01); *H01J 2237/202* (2013.01); *H01J 2237/31701* (2013.01)

(58) Field of Classification Search
CPC ........ H01J 37/185; H01J 37/20; G02B 5/1857
USPC .......................... 250/453.11, 454.11, 455.11, 491.1,250/492.1, 492.2, 492.22, 492.3
See application file for complete search history.

(56) References Cited

U.S. PATENT DOCUMENTS

| | | | |
|---|---|---|---|
| 3,498,711 A | 3/1970 | Ables et al. | |
| 3,775,644 A | 11/1973 | Cotner et al. | |
| 4,475,223 A * | 10/1984 | Taniguchi | G03F 7/20 250/491.1 |
| 4,599,970 A | 7/1986 | Peterson | |
| 4,699,555 A | 10/1987 | Guarino | |
| 4,913,789 A | 4/1990 | Aung | |
| 4,915,057 A | 4/1990 | Boudreau et al. | |

(Continued)

FOREIGN PATENT DOCUMENTS

CN 1662978 A 8/2005
CN 1818719 A 8/2006

(Continued)

OTHER PUBLICATIONS

Office Action in U.S. Appl. No. 13/866,856 dated Nov. 6, 2014.

(Continued)

*Primary Examiner* — Jason McCormack
(74) *Attorney, Agent, or Firm* — Nixon Peabody LLP; Joseph Bach, Esq.

(57) ABSTRACT

System and method to align a substrate under a shadow mask. A substrate holder has alignment mechanism, such as rollers, that is made to abut against an alignment straight edge. The substrate is then aligned with respect to the straight edge and is chucked to the substrate holder. The substrate holder is then transported into a vacuum processing chamber, wherein it is made to abut against a mask straight edge to which the shadow mask is attached and aligned to. Since the substrate was aligned to an alignment straight edge, and since the mask is aligned to the mask straight edge that is precisely aligned to the alignment straight edge, the substrate is perfectly aligned to the mask.

16 Claims, 3 Drawing Sheets

(56) References Cited

U.S. PATENT DOCUMENTS

| | | | |
|---|---|---|---|
| 4,915,564 A | 4/1990 | Eror et al. | |
| 5,164,974 A * | 11/1992 | Kariya | G03F 7/70733 250/491.1 |
| 5,567,267 A | 10/1996 | Kazama et al. | |
| 5,688,389 A | 11/1997 | Bjornard et al. | |
| 5,846,328 A | 12/1998 | Aruga et al. | |
| 5,993,614 A | 11/1999 | Nomura | |
| 6,083,566 A | 7/2000 | Whitesell | |
| 6,084,494 A | 7/2000 | Chew et al. | |
| 6,146,489 A | 11/2000 | Wirth | |
| 6,251,232 B1 | 6/2001 | Aruga et al. | |
| 6,291,114 B1 | 9/2001 | Reijers | |
| 6,475,287 B1 | 11/2002 | Clark | |
| 6,589,382 B2 | 7/2003 | Clark et al. | |
| 7,429,300 B2 | 9/2008 | Kido et al. | |
| 7,785,663 B2 | 8/2010 | Kido et al. | |
| 8,349,196 B2 | 1/2013 | Fairbairn et al. | |
| 8,378,318 B1 * | 2/2013 | Gammel | H01J 37/20 250/397 |
| 9,082,799 B2 * | 7/2015 | Weaver | C23C 14/042 |
| 2002/0011406 A1 | 1/2002 | Shishido et al. | |
| 2002/0179013 A1 | 12/2002 | Kido et al. | |
| 2002/0187265 A1 | 12/2002 | Mori et al. | |
| 2003/0074097 A1 | 4/2003 | Mautz et al. | |
| 2003/0087471 A1 | 5/2003 | Shtein et al. | |
| 2003/0108805 A1 | 6/2003 | Clark | |
| 2003/0221614 A1 | 12/2003 | Kang et al. | |
| 2004/0020435 A1 | 2/2004 | Tsuchiya et al. | |
| 2004/0037732 A1 | 2/2004 | Shiga et al. | |
| 2004/0049308 A1 | 3/2004 | Evers et al. | |
| 2004/0115342 A1 | 6/2004 | Shigemura | |
| 2004/0168634 A1 | 9/2004 | Mori et al. | |
| 2005/0034673 A1 | 2/2005 | Kim | |
| 2005/0232734 A1 | 10/2005 | Elliott et al. | |
| 2006/0150910 A1 | 7/2006 | Han et al. | |
| 2006/0187431 A1 | 8/2006 | Shibazaki | |
| 2006/0201618 A1 | 9/2006 | Kang et al. | |
| 2006/0266718 A1 | 11/2006 | Tischner et al. | |
| 2007/0009671 A1 | 1/2007 | Manz | |
| 2008/0299296 A1 | 12/2008 | Kido et al. | |
| 2009/0016857 A1 | 1/2009 | Nakamura | |
| 2009/0017192 A1 | 1/2009 | Matsuura | |
| 2009/0145879 A1 | 6/2009 | Fairbairn et al. | |
| 2009/0179651 A1 | 7/2009 | Elgar et al. | |
| 2009/0185892 A1 | 7/2009 | Aburatani | |
| 2009/0194026 A1 | 8/2009 | Burrows et al. | |
| 2009/0250574 A1 | 10/2009 | Fullerton et al. | |
| 2009/0291610 A1 | 11/2009 | Sasaki | |
| 2009/0324379 A1 | 12/2009 | He et al. | |
| 2010/0003768 A1 | 1/2010 | Barnes et al. | |
| 2010/0092668 A1 | 4/2010 | Hegedus | |
| 2010/0111650 A1 | 5/2010 | Quach et al. | |
| 2010/0120233 A1 | 5/2010 | He | |
| 2010/0296903 A1 | 11/2010 | Shah et al. | |
| 2011/0075145 A1 | 3/2011 | Dohse | |
| 2011/0141448 A1 | 6/2011 | Aoki et al. | |
| 2011/0174217 A1 | 7/2011 | Gersdorff et al. | |
| 2011/0207261 A1 | 8/2011 | Watai et al. | |
| 2011/0234344 A1 | 9/2011 | Fullerton et al. | |
| 2012/0006257 A1 | 1/2012 | Higashisaka et al. | |
| 2012/0048186 A1 | 3/2012 | Bruning et al. | |
| 2012/0170999 A1 | 7/2012 | Sakaue | |
| 2012/0199477 A1 | 8/2012 | Uenosono | |
| 2013/0071208 A1 | 3/2013 | Hosek | |
| 2013/0176691 A1 | 7/2013 | Stevens et al. | |
| 2013/0276978 A1 | 10/2013 | Bluck et al. | |
| 2013/0287526 A1 | 10/2013 | Bluck et al. | |
| 2015/0170947 A1 | 6/2015 | Bluck et al. | |

FOREIGN PATENT DOCUMENTS

| | | | |
|---|---|---|---|
| CN | 1861833 A | 11/2006 | |
| CN | 101864552 A | 10/2010 | |
| CN | 102165095 A | 8/2011 | |
| CN | 104582863 A | 4/2015 | |
| CN | 104685095 A | 6/2015 | |
| DE | 102008037387 A1 | 3/2010 | |
| EP | 1365040 A1 | 11/2003 | |
| EP | 2423350 A1 | 2/2012 | |
| EP | 2839052 A1 | 2/2015 | |
| EP | 2852469 A1 | 4/2015 | |
| JP | 2000-048954 A | 2/2000 | |
| JP | 2000-173769 A | 6/2000 | |
| JP | 2001-49422 A | 2/2001 | |
| JP | 2001-110567 A | 4/2001 | |
| JP | 2001-203079 A | 7/2001 | |
| JP | 2001-247961 A | 9/2001 | |
| JP | 2001-273979 A | 10/2001 | |
| JP | 2002-008859 A | 1/2002 | |
| JP | 2002-009098 A | 1/2002 | |
| JP | 2004-214185 A | 7/2004 | |
| JP | 2015-520799 A | 7/2015 | |
| JP | 2015-521373 A | 7/2015 | |
| KR | 10-2015-0051935 A | 5/2015 | |
| KR | 10-2015-0053733 A | 5/2015 | |
| TW | 569284 B | 1/2004 | |
| TW | I229916 B | 3/2005 | |
| TW | I343087 B | 6/2011 | |
| TW | 201130929 A | 9/2011 | |
| TW | I356467 B | 1/2012 | |
| TW | 201349384 A | 12/2013 | |
| TW | 201401412 A | 1/2014 | |
| TW | 201541546 A | 11/2015 | |
| TW | I518832 B | 1/2016 | |
| TW | I518839 B | 1/2016 | |
| WO | 99/61689 A1 | 12/1999 | |
| WO | 2011024853 A1 | 3/2011 | |
| WO | 2013159050 A1 | 10/2013 | |
| WO | 2013163622 A1 | 10/2013 | |
| WO | 2015/127191 A1 | 8/2015 | |
| WO | 2016/022728 A1 | 2/2016 | |

OTHER PUBLICATIONS

Office Action in U.S. Appl. No. 13/866,856 dated Jun. 5, 2015.
International Search Report and Written Opinion in PCT Application No. PCT/US2013/037464, mailed Sep. 6, 2013.
International Preliminary Report on Patentability in PCT Application No. PCT/US2013/037464, mailed Sep. 11, 2014.
Examination Report in Taiwanese Patent Application No. 102113908 dated Apr. 30, 2015.
Office Action in U.S. Appl. No. 13/871,871 dated Dec. 5, 2014.
Office Action in U.S. Appl. No. 13/871,871 dated Aug. 28, 2015.
International Search Report and Written Opinion in PCT Application No. PCT/US2013/038530, mailed Aug. 16, 2013.
International Preliminary Report on Patentability in PCT Application No. PCT/US2013/038530, mailed Nov. 6, 2014.
Extended Search Report for European Patent Application No. 13780965.3 dated Aug. 3, 2015.
Search and Examination Report for Singapore Patent Application No. 11201406893X dated Aug. 18, 2015.
Examination Report in Taiwanese Patent Application No. 102114999 dated Jul. 29, 2015.
Invitation to Pay Additional Fees for PCT/US2015/016799 dated Apr. 22, 2015.
International Search Report and Written Opinion for PCT/US2015/016799 dated Jun. 26, 2015.
Fiepke, J. W., "Permanent Magnet Materials," ASM Handbook vol. 2: Properties and Selection: Nonferrous Alloys and Special-Purpose Materials, (1990) ASM International. pp. 782-803.
Carpenter Technology Corporation, KOVAR® Alloy Technical Data Sheet, Oct. 1, 1990, pp. 1-4.
Office Action in U.S. Appl. No. 13/866,856 dated Feb. 2, 2016.
Office Action in Chinese Patent Application No. 201380026127.4 dated Mar. 3, 2016.
Office Action in U.S. Appl. No. 13/871,871 dated Jan. 21, 2016.
Notice of Allowance in Taiwanese Patent Application No. 102113908 dated Sep. 30, 2015.

(56) References Cited

OTHER PUBLICATIONS

Office Action for Chinese Patent Application No. 201380033430.7 dated Oct. 23, 2015.
Notice of Allowance in Taiwanese Patent Application No. 102114999 dated Oct. 16, 2015.
International Search Report and Written Opinion for PCT/US2015/043884 dated Oct. 23, 2015.
Notice of Allowance in U.S. Appl. No. 13/866,856 dated Aug. 11, 2016.
Notice of Allowance in U.S. Appl. No. 13/871,871 dated Jun. 17, 2016.

* cited by examiner

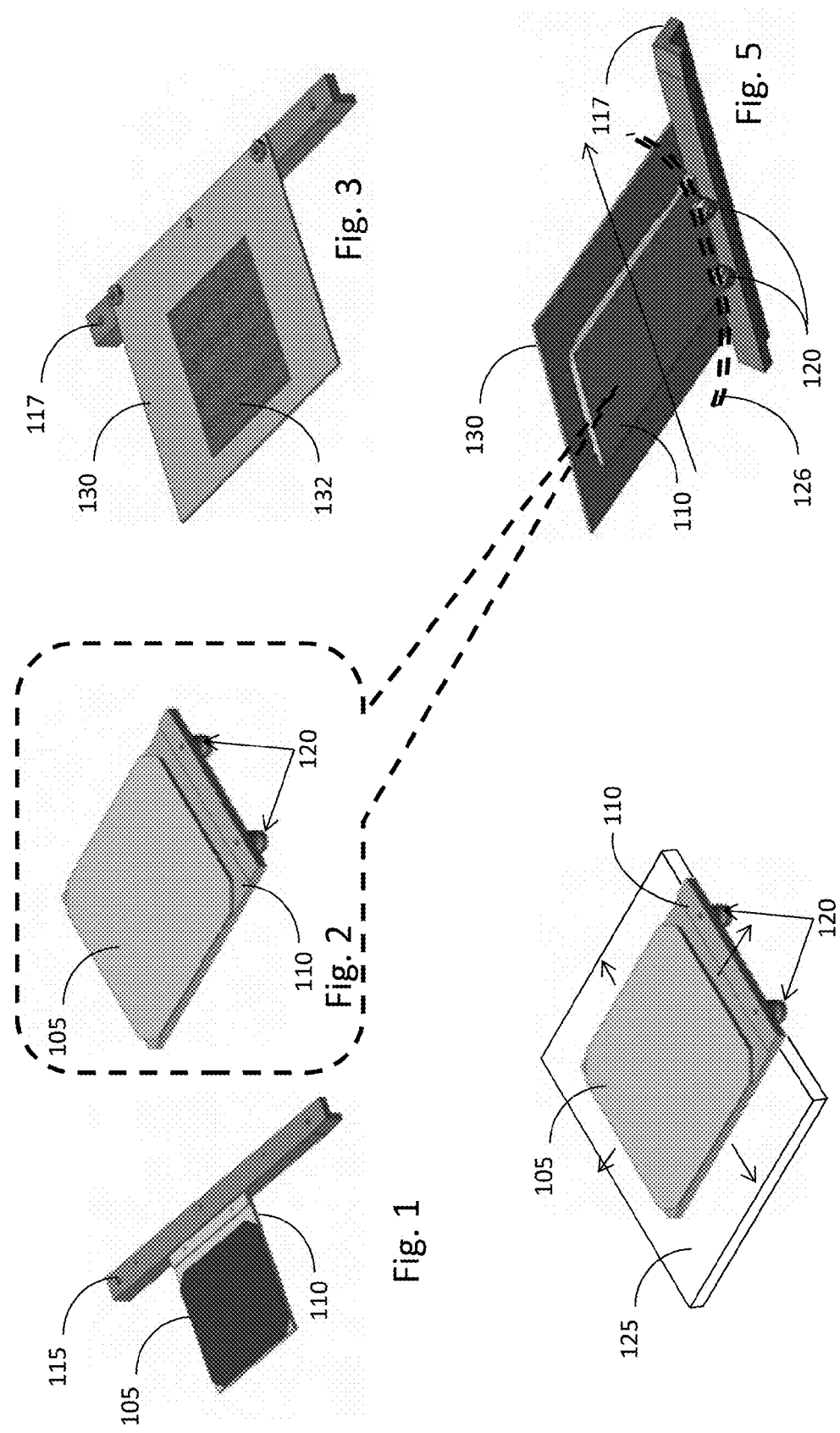

IMPLANT MASKING AND ALIGNMENT SYSTEM WITH ROLLERS

RELATED APPLICATION

This application claims priority from U.S. Provisional Application No. 62/033,104, which was filed on Aug. 5, 2014, the entire disclosure of which is incorporated herein by reference.

BACKGROUND

1. Field

This disclosure relates to fabrication of semiconductor devices and, more specifically, to the use of masks during the fabrication process, such as masked ion implant process.

2. Related Arts

Typically implanted pattern has stringent requirements for accuracy of features, such as location and spacing of implanted lines. The lines may be, for example, implant for increase conductance under metal fingers used to draw current from solar cells. These lines may be very thin and very dense (i.e., narrow pitch), requiring high accuracy of the implant. Many times more than one implanted pattern is needed on the same substrate. In that case, high level of accuracy needs to be maintained not only in one implant step but through multiple implant steps—sometimes across several processing tools. In order to achieve this, high precision alignment is necessary between the substrate and the patterning mask. Common approach is to precision align the mask and substrate together in vacuum and then implant through the mask. But such an approach has some challenges, including the following. Precision alignment in vacuum environment, optically or by other means, is difficult and very expensive. For multiple implants, precision alignment needs to be repeated multiple times to accommodate each mask change for different patterns. Exchanging masks in vacuum environment adds alignment inaccuracy, cost and complexity.

Accordingly, there is a need in the art for simpler system for alignment of substrates to masks. Generally, any alignment steps that can be performed in atmospheric environment reduce the complexity and cost of the system. Moreover, removing the requirement for precise orientation during the transport of the substrate holder throughout the system would further reduce the complexity and cost of the system.

SUMMARY

The following summary of the invention is intended to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments enable processing a substrate using one or more masks, all precisely aligned to the substrate. This enables generating multiple patterns on the substrate, all inter-aligned. The initial alignment step may be performed in atmospheric environment, before the substrates are introduced into vacuum, and maintained throughout the processing in vacuum. Moreover, the substrate holder need not be precisely oriented thorough its transport through the system. Rather, in each station alignment mechanism is provided that ensures precise orientation of the holder, such that the substrate is precisely aligned to the mask. It should be understood that the reference to "masks" in this context is to a mask that is made of a thin sheet, e.g., thin metal sheet, sometimes referred to as a shadow mask.

According to disclosed embodiments, the substrate is precision aligned (optically or by other means) to a reference edge in atmosphere, and then it self-aligns to multiple masks with built in guide bar as it travels under each mask. This approach offers multiple advantages. For example, precision alignment can be done in atmosphere where a lot more options and less expensive solutions are available. The masks can be fixed and don't need to come out of vacuum for aligning each successive mask. Also, since the masks can stay stationary in their respective station, the masks can achieve thermal equilibrium so that dimensional variation due to thermal effect can be minimized. Since the mask remains in the vacuum, it is not subjected to thermal cycles, thereby minimizing flaking. Also, since the mask is stationary, there's less mechanical handling. This is beneficial since typically masks are fragile and can break upon mechanical handling. Also, multiple implants can be done through different masks without need of precision alignment for each mask change.

According to disclosed aspect, a system for aligning a substrate to a processing mask is provided, comprising: a substrate holder having a holder alignment mechanism; a system guide configured to be engaged by the holder alignment mechanism to thereby orient the substrate holder to the system guide; a mask alignment mechanism attached to a processing chamber and aligned to the system guide, the mask alignment mechanism having mask attachment mechanism for attaching a processing mask in precise alignment to the mask alignment mechanism; and tracks positioned below the processing mask and configured to enable the substrate holder to place substrates below the mask when the holder alignment mechanism engages the mask alignment mechanism. The holder alignment mechanism may comprise at least two rollers. The system guide may comprise a straight edge configured to be engaged by the rollers. The mask alignment mechanism may comprises a straight bar configured to be engaged by the rollers. The system may further comprise a carrier configured for traveling on the tracks and supporting the substrate holder. The substrate holder can be configured to freely move in two degrees of freedom over the carrier. The carrier may comprise a seat and the substrate holder may comprise an extension configured to extend into the seat with sufficient clearance to enable the substrate holder to move in two degrees of freedom. The carrier can be configured to hold a plurality of substrate holders simultaneously. The carrier may be configured to hold a linear array of 1×n substrate holders, wherein n is a natural number equal to or larger than 2. The mask alignment mechanism may comprise a plurality of straight bars, each configured to engage one of the substrate holders and each having one mask attached thereto. The rollers can be magnetized, and the straight edge and the straight bar are made of paramagnetic or ferromagnetic material. Alternatively, or in addition, reflexive guides may be provided to urge the substrate holder against the straight bar.

According to further aspects, an ion implant system is provided, comprising: an atmospheric alignment chamber comprising tracks and a holder alignment mechanism; a vacuum ion implant chamber coupled to the atmospheric alignment chamber and comprising, an ion source, tracks, mask alignment mechanism aligned to the holder alignment mechanism, and mask attached to the mask alignment mechanism; and a substrate holder configured for chucking a substrate and having engaging mechanism to orient the substrate holder while engaging the holder alignment mechanism and when engaging the mask alignment mechanism. The holder alignment mechanism may comprise a straight edge and the mask alignment mechanism may comprise a straight edge aligned in parallel orientation to the holder alignment mechanism. The engaging mechanism may comprise a plurality of wheels configured for engaging the holder alignment mechanism and the mask alignment mechanism, and may further comprise resilient guides configured for urging the substrate holder against the straight edge. At least one of the wheels or straight edge may be magnetized. The system may further comprise a carrier configured for riding on the tracks and supporting the substrate holder. The carrier can be configured to enable the substrate holder to freely move in two degrees of freedom.

According to further aspects, a method for aligning a substrate to a shadow mask is provided, comprising: placing a substrate on top of a substrate holder; abutting the substrate holder against an alignment straight edge and orienting the substrate to a desired orientation; chucking the substrate to the substrate holder at the desired orientation while the substrate holder is abutted against the alignment straight edge; moving the substrate holder into a vacuum chamber having a shadow mask attached to a mask straight edge; abutting the substrate holder against the mask straight edge in a position that places the substrate under the shadow mask; executing a processing step on the substrate through the mask; and moving the substrate holder out of the vacuum chamber. The abutting the holder against an alignment strait edge may comprise pressing rollers attached to the substrate holder against the alignment straight edge. Orienting the substrate to a desired orientation may comprise orienting the substrate according to fiduciary marks on the alignment straight edge.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1, illustrates a substrate on a substrate holder, wherein the substrate holder is aligned to an external precision edge, according to one embodiment.

FIG. 2, illustrates a substrate on a substrate holder, wherein the substrate holder has alignment rollers to aligned to an external precision edge, according to one embodiment.

FIG. 3, illustrates a mask attached to a mask holder, wherein the mask is aligned to and coupled to a precision edge as a guide bar, according to one embodiment.

FIG. 4, illustrates a top view of a substrate on a substrate holder, wherein the substrate holder is positioned on top of a carrier, according to one embodiment.

FIG. 5, illustrates a bottom view of a substrate on a substrate holder, wherein the substrate holder is aligned to a precision guide bar that supports the mask, according to one embodiment.

DETAILED DESCRIPTION

Figure 8:
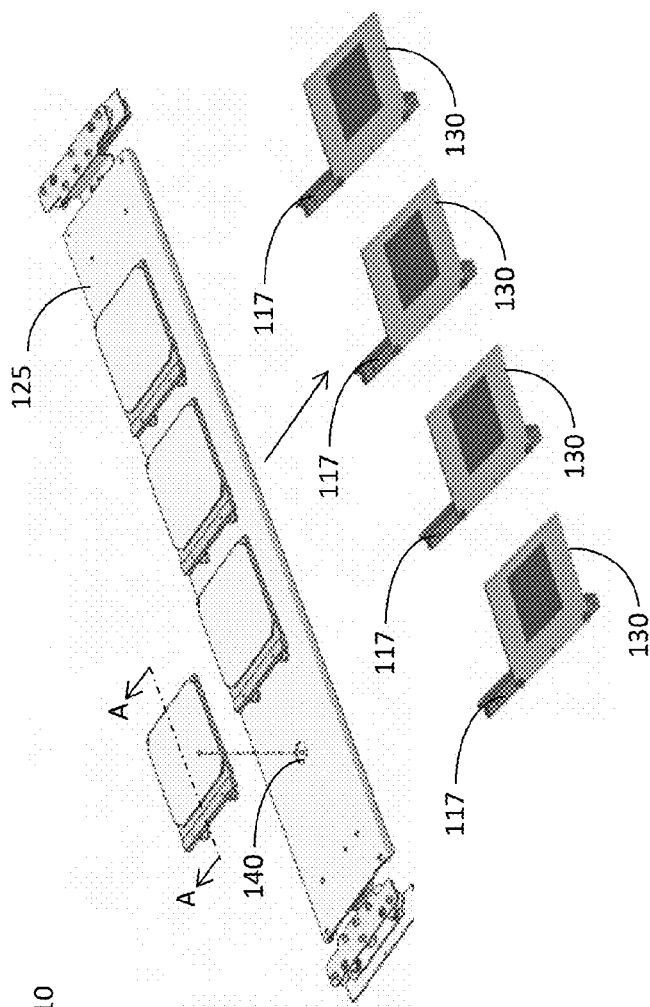
FIG. 8, illustrates an arrangement for a substrate holder to be positioned in a floating arrangement, i.e., free to move in the plane of the carrier so as to enable the substrate holder to align to an external precision edge and the mask guide bar, according to one embodiment.

According to various embodiments, the substrate sits on an electro static chuck or other susceptor or holder (hereinafter referred to simply as holder, to encompass any means of supporting and chucking a substrate) and the holder travels on a carrier in and out of the vacuum system. The substrate holder has multiple alignment features and/or rollers on one or multiple sides of the holder, which are brought into contact with a precision reference edge (either in atmosphere or in vacuum). The alignment feature is magnetically, mechanically or otherwise brought in precise alignment to the precision reference edge, so that the alignment feature is pressed against the edge. In one embodiment, the alignment feature comprises rollers, and the roller's tangents adhere to alignment edge of an alignment bar. The substrate is precision-aligned (for example optically) to the fixed reference edge of the holder, and hence to the tangent of the holder's alignment feature, e.g., the rollers. A number of features are built into the holder/carrier to enhance the alignment of optical or mechanical methods and can be used as references or fudicial markings.

After the substrate is aligned to the holder, it is then clamped (for example using electrostatic chuck, vacuum chuck, mechanical chuck, etc.) on the substrate holder to prevent it from moving away from its location and orientation. This is achieved, e.g., using a capacitive charging method, where the holder is then detached and free to move out of the alignment position, while the substrate remains chucked to precise orientation. Since the holder is aligned to the reference edge, and the substrate is aligned to the holder, the substrate is precision aligned to the reference edge. When rollers are used for the alignment, the substrate is aligned to a line tangent to alignment rollers on the holder.

FIGS. 1 and 2 illustrate one embodiment, wherein rollers are used to align the holder to the precision edge. As illustrated, wafer 105 is placed on top of the wafer holder 110. This can be done, e.g., in an atmospheric loading module, manually or using robot arm. The rollers 120 of the holder 110 are then brought into contact against the precision straight edge 115. The rollers 120 and straight edge are machine with precision, such that repeated engagement of the wheels 120 with the edge 115 would lead to the exact same orientation of the holder 110 with respect to the edge 115. While maintaining the engaged position, the wafer is aligned to a pre-selected orientation with respect to the straight edge. Once aligned, the wafer is chucked/clamped to the holder. Note that the wafer's orientation or alignment to the holder 110 is immaterial—what's of concern is the alignment of the wafer 105 to the straight edge 115. Once the wafer 105 has been chucked to the holder 110 at the proper orientation to the straight edge 115, whenever the holder 110 is brought into contact with the straight edge 115, the wafer will be aligned to the straight edge 115.

As illustrated in FIG. 3, a mask 130 is attached to a straight edge 117 (sometimes referred to herein as straight bar 117, to assist the reader in distinguishing it from the straight edge used for the initial alignment of the substrate). The straight edge 117 is positioned in precise alignment corresponding to straight edge 115, in that when the wheels 120 of holder 110 engage the straight edge 117, the wafer will be aligned with the same orientation to straight edge 117 as it was to straight edge 115. The mask 130 is attached to the straight edge 117 such that the pattern 132 is aligned to the straight edge 117. Since the wafer 105 is aligned to straight edge 117 and the pattern 132 is also aligned to the straight edge 117, the pattern 132 is aligned to the wafer 105.

The system may have several masks 130 attached to corresponding straight edges 117, such that the holder can be transferred from one location to another and, at each station when the rollers 120 engage the straight edge 117 it is ensured that the mask is aligned to the wafer. This is illustrated in FIG. 5, which is a view looking up from underneath the holder and mask. As shown, the wheels 120 engage the straight edge/bar 117. To ensure proper alignment of the holder 110 to the mask straight edge 117, the wheels 120 must properly engage the straight edge 117. To achieve this, the wheels may be magnetized such that they are attracted to abut or press against the straight edge 117. Other methods may be employed. For example, as shown in broken lines, a spring loaded or resilient guide rail 126 may urge the wheels 120 against the straight edge 117. Other mechanism may be used, as long as it is ensured that the wheels are urged to abut/press against the straight edge to ensure proper alignment.

The mask 130 is attached to the straight edge 117, above the location of the wafer 105. The holder 110 may travel with the wheels contacting the straight edge for pass-by processing, or it may stop at a specific location under the mask for static processing. Regardless of the type of processing, the one or more straight edges 117 are all aligned to straight edge 115 throughout the system. Consequently, precision is only required for the alignment of the straight edges, which ensures that the wafers and masks will always be aligned, while precision can be relaxed during transport of the holder. Thus, the holder 110 may be fabricated using simple and inexpensive design since none of the wafers and masks need to be aligned to the holder.

FIG. 4 illustrates an embodiment wherein the wafer holder 110 is transported within the system on a carrier 125. As shown by the arrows, the holder 110 is placed on the carrier 125 such that it may freely move over two degrees of freedom, i.e., in the plan of the carrier top surface. While the movement may be restricted to a predetermined extent, it is sufficient to allow the holder 110 to freely change its orientation with respect to the carrier 125. Ideally, the holder is restricted from changing its elevation. Consequently, when the carrier enters a processing chamber having a mask with a straight edge positioned therein, the carrier moves to a position causing the wheels 120 to engage the straight edge 117. Since the holder 110 cam freely move to change its orientation on top of the carrier 125, the holder can be aligned by wheels 120 to a precise position under the mask, at a predefined distance below the mask.

In disclosed embodiments the substrate holder 110 "floats" in the carrier 125. The carrier 125 transports the substrate 105, which was previously precision aligned to rollers 120, under one or multiple masks, depending on the series of implants needed. The holder 110 and carrier 125 are acting as substrate retainer and can be made to improve substrate thermal cooling and electrical discharge paths by serving as heat sinks and electrical conduits. However, no precision is needed to ensure alignment of the substrate 105 to the holder 110 or the carrier 125. The alignment is, in essence, between the wafer and the alignment retainer which, in the embodiments disclosed are the wheels 120.

Figure 6:
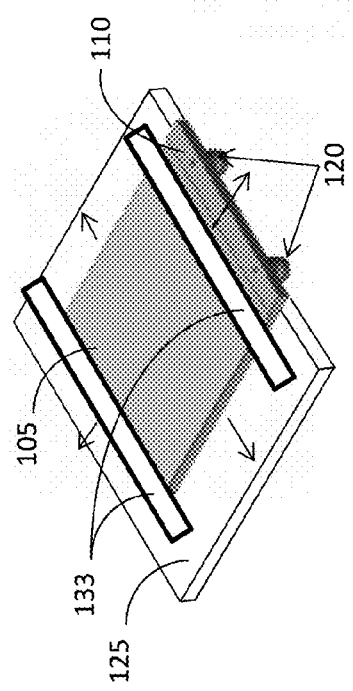
FIG. 6, illustrates a substrate holder positioned on the carrier, and an obscuring mechanism provided for masking part of the substrate, according to one embodiment.

In some embodiments, the holder and/or carrier can have obscuring mechanism that can further shadow the substrate from the implant and depositions. For example, the holder and/or carrier may have obscuring mechanism, e.g., incorporated shadow mask, which cover the edges of the wafer to prevent edge shunting. FIG. 6 illustrates an example wherein two bars 133 cover two edges of wafer 105. Bars 133 can be attached to the holder 110 or carrier 125 and pass under the masks. Thus, the actual pattern of ion implant is the resulting of ions passing through the shadow mask on the ion implant source and the shadow mask incorporated in the holder or carrier.

Figure 7:
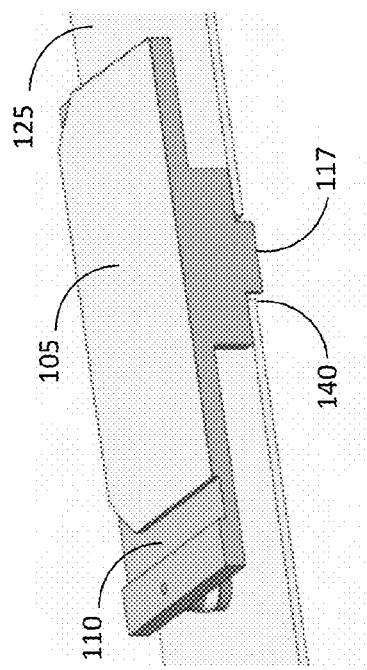
FIG. 7, illustrates a close-up of one substrate on a corresponding substrate holder, wherein the substrate holder is positioned in a floating arrangement, i.e., free to move in the plane of the carrier so as to enable the substrate holder to align to an external precision edge and the mask guide bar, according to one embodiment.

FIG. 7 is a cross-section along line A-A of FIG. 8, illustrating an example of how the holder 110 can be floating on top of the carrier 125, while having motion in two degrees of freedom to allow for alignment. In this example, the carrier 125 includes a seat 140—in this case an indentation of a hole having a circular shape. The holder 110 has an extension 117 that extends into the seat 140. The exterior dimension of the extension 117 is configured to be smaller than the interior dimension of the seat 140, such that a space or clearance between the extension 117 and the seat 140 enables "free play" in two degrees of freedom. In the example of FIG. 7 the seat and the extension 117 are circular, such that the exterior diameter of extension 117 is smaller than the interior diameter of the seat 140 by a pre-designed amount, enabling free space between the extension 117 and the seat 140.

FIG. 8 illustrates an example wherein one carrier 125 includes several seats 140 enabling carrying a plurality of holders 110 simultaneously. In the example of FIG. 8, carrier 125 carries a linear array of 1×n holders 110, n being a natural number equal to or greater than 2. A similar number of masks and corresponding straight edges are situated in each processing chamber, such that the array of 1×n substrates can be aligned and processed simultaneously. The carrier 125 travels through the system in the direction marked by the arrow, such that the multiple holders 110 engage the corresponding straight edges 117 to bring the wafers under the masks 130 simultaneously.

Figure 9:
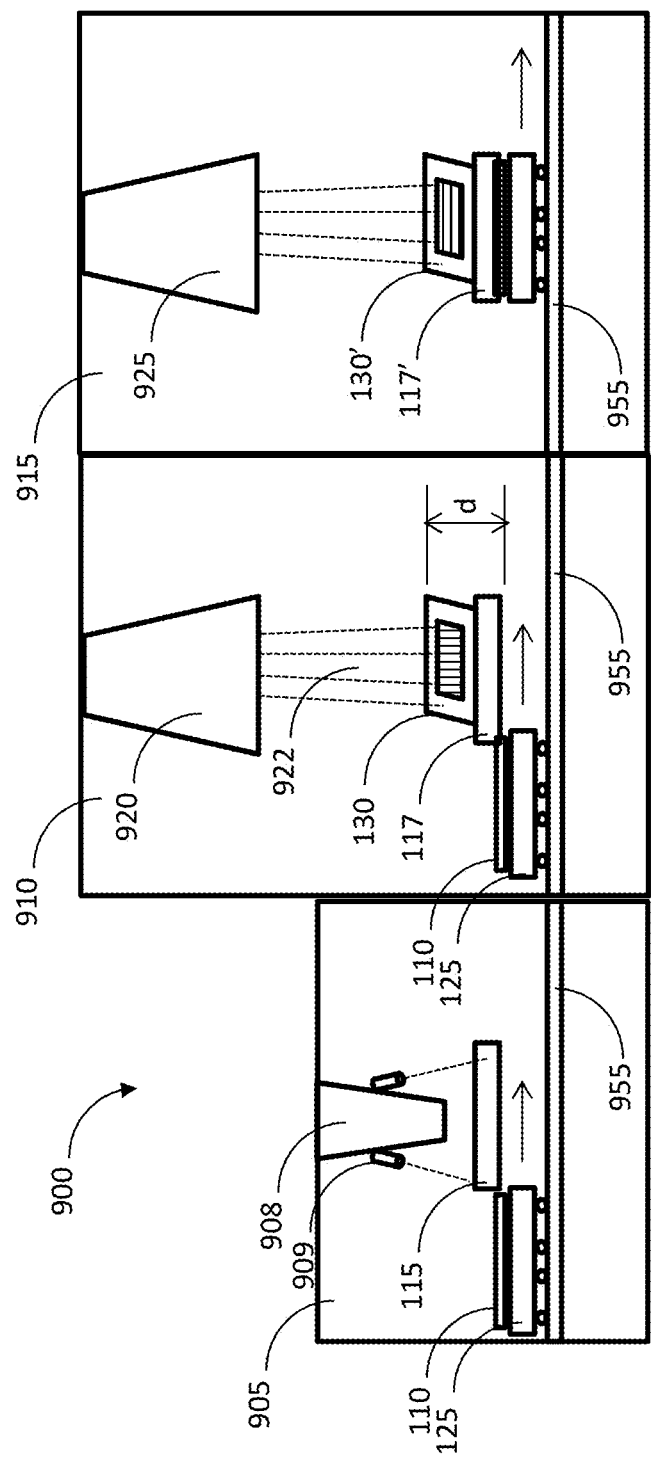
FIG. 9, illustrates an ion implant system according to one embodiment.

FIG. 9 illustrates an example of an implant system 900 having an alignment chamber 905, a first implant chamber 910 and a second alignment chamber 915. In the implant system 900, each implant source 920, 925 has a corresponding mask 130, 130' that has precision aligned guide bar 117, 117' as an alignment assembly. The precision aligned guide bar 117, 117' is precisely aligned to the reference edge 115 of the substrate alignment chamber 905. The mask features are precision aligned to the guide bar 117, 117' prior to or during installation in the system 900.

The carrier first enters the alignment module 905, wherein the substrate holder 110 engages the alignment straight edge 115, and the wafer is aligned to the straight edge, or to fiduciary marks provided on the straight edge or the holder. The alignment may be performed using an aid, such as, e.g., optical camera 908, which may also include laser pointers 909 to mark the proper positioning of the substrate on the holder 110. Once the wafer is aligned, it is chucked to the holder 110.

As the carrier 125, with holder 110 chucking the substrate, travels on tracks 955 to position the substrate under the mask, the alignment rollers of the floating substrate holder 110 (pre-aligned to substrate) gets attached to the mask guide bar 117, 117' (for example mechanically and/or magnetically) and freely rolls past, or stops if required, underneath the mask 130, 130'. The line tangent to alignment rollers is aligned to the mask guide bar 117, 117'. Since the substrate is aligned to these rollers, the substrate is now aligned to the mask guide bar and hence to the features/pattern on the mask. The ion beam 922 is continuously on or is pulsed as necessary, and wafers pass by or can be stationary underneath the mask to generate the required implant pattern on the substrate.

In some embodiments, the vertical gap, designated "d" in FIG. 9, between the substrate and the mask 130 can be adjusted to provide next level of implanted zone definition. Alternatively, or in addition, the beam optics manipulation can be used to adjust beam divergence in the orthogonal direction to provide the desired implanted zone dimension. Either or both substrate holder and/or mask can be floating to allow for alignment of rollers to the mask precision edge.

After the implant process is completed in chamber 910, the carriers move on to the next implant chamber 915 and the holder 110 self-aligns to the next mask 130'. It is noted that while in FIG. 9, ion implant sources 920 and 925 are illustrated as being within two separate chambers 910 and 915, they may actually reside within the same vacuum chamber.

It should be appreciated that the disclosed embodiments avoid complex and costly alignment set-up in vacuum and provide greater degree of freedom for mask and substrate holder fabrication. Many of the parts of the system, including the holder and the carrier can be fabricated inexpensively and need not include alignment mechanism to align the substrates. All that is required is to initially align all of the mask guide bars to the straight edge 115. Then each mask is aligned to its guide bar and is fixed in its proper alignment. This also needs to be performed only once. Then, each wafer is simply aligned to the straight edge, which makes it automatically aligned to all of the masks in the system.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the vacuum chamber arts. It is intended that the specification and examples be considered as exemplary only, with a true scope and spirit of the invention being indicated by the following claims.

The invention claimed is:

1. A system for aligning a substrate to a processing mask, comprising:
    a substrate holder having a holder alignment mechanism;
    a system guide configured to be engaged by the holder alignment mechanism to thereby orient the substrate holder to the system guide;
    a mask alignment mechanism attached to a processing chamber and aligned to the system guide, the mask alignment mechanism having mask attachment mechanism for attaching a processing mask in alignment to the mask alignment mechanism;
    tracks positioned below the processing mask and configured to enable the substrate holder to place substrates below the mask when the holder alignment mechanism engages the mask alignment mechanism;
    wherein the holder alignment mechanism comprises at least two rollers.

2. The system of claim 1, wherein the system guide comprises a straight edge configured to be engaged by the rollers.

3. The system of claim 2, wherein the mask alignment mechanism comprises a straight bar configured to be engaged by the rollers.

4. The system of claim 3, further comprising a carrier configured for traveling on the tracks and supporting the substrate holder.

5. The system of claim 4, wherein the substrate holder is configured to move in two degrees of freedom over the carrier.

6. The system of claim 5, wherein the carrier comprises a seat and the substrate holder comprises an extension configured to extend into the seat with sufficient clearance to enable the substrate holder to move in two degrees of freedom.

7. The system of claim 4, wherein the carrier is configured to hold a plurality of substrate holders simultaneously.

8. The system of claim 4, wherein the carrier is configured to hold a linear array of 1×n substrate holders, wherein n is a natural number equal to or larger than 2.

9. The system of claim 4, wherein the mask alignment mechanism comprises a plurality of straight bars, each configured to engage one of the substrate holders and each having one mask attached thereto.

10. The system of claim 3, wherein the rollers are magnetized, and wherein the straight edge and the straight bar are made of paramagnetic or ferromagnetic material.

11. An ion implant comprising:
    an atmospheric alignment chamber comprising tracks and a holder alignment mechanism;
    a vacuum ion implant chamber comprising: an ion source, tracks, mask alignment mechanism aligned to the holder alignment mechanism, and mask attached to the mask alignment mechanism;
    a substrate holder configured for chucking a substrate and having engaging mechanism to orient the substrate holder while engaging the holder alignment mechanism and when engaging the mask alignment mechanism;
    wherein the holder alignment mechanism comprises a straight edge and wherein the mask alignment mechanism comprises a straight edge aligned in correspondence to the holder alignment mechanism; and, wherein the engaging mechanism comprises a plurality of wheels configured for engaging the holder alignment mechanism and the mask alignment mechanism.

12. The system of claim 11, wherein at least one of the wheels and straight edge are magnetized.

13. The system of claim 11, further comprising a carrier configured for riding on the tracks and supporting the substrate holder.

14. The system of claim 13, wherein the carrier is configured to enable the substrate holder to freely move in two degrees of freedom.

15. A method for aligning a substrate to a shadow mask, comprising:

placing a substrate on top of a substrate holder;

abutting the substrate holder against an alignment straight edge and orienting the substrate to a desired orientation;

chucking the substrate to the substrate holder at the desired orientation while the substrate holder is abutted against the alignment straight edge;

moving the substrate holder into a vacuum chamber having a shadow mask attached to a mask straight edge;

abutting the substrate holder against the mask straight edge in a position that places the substrate under the shadow mask;

executing a processing step on the substrate through the mask;

moving the substrate holder out of the vacuum chamber; and, wherein abutting the holder against an alignment strait edge comprises pressing rollers attached to the substrate holder against the alignment straight edge.

16. The method of claim 15, wherein orienting the substrate to a desired orientation comprises orienting the substrate according to fiduciary marks on the alignment straight edge.

\* \* \* \* \*